United States Patent
Hwang et al.

(10) Patent No.: US 9,425,179 B2
(45) Date of Patent: Aug. 23, 2016

(54) CHIP PACKAGES AND METHODS OF MANUFACTURE THEREOF

(71) Applicant: Taiwan Semiconductor Manufacturing Company, Ltd., Hsin-Chu (TW)

(72) Inventors: Chien Ling Hwang, Hsin-Chu (TW); Pei-Hsuan Lee, Tainan (TW); Ying-Jui Huang, Taipei (TW); Yeong-Jyh Lin, Caotun Township (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/472,785

(22) Filed: Aug. 29, 2014

(65) Prior Publication Data

US 2016/0064367 A1    Mar. 3, 2016

(51) Int. Cl.
*H01L 21/00*    (2006.01)
*H01L 25/00*    (2006.01)
*H01L 25/065*   (2006.01)
*H01L 25/18*    (2006.01)
*H01L 23/00*    (2006.01)
*H01L 23/31*    (2006.01)

(52) U.S. Cl.
CPC .......... *H01L 25/50* (2013.01); *H01L 25/0657* (2013.01); *H01L 25/18* (2013.01); *H01L 23/3128* (2013.01); *H01L 24/13* (2013.01); *H01L 24/16* (2013.01); *H01L 24/17* (2013.01); *H01L 24/32* (2013.01); *H01L 24/73* (2013.01); *H01L 24/81* (2013.01); *H01L 24/92* (2013.01); *H01L 2224/0401* (2013.01); *H01L 2224/06181* (2013.01); *H01L 2224/1312* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13123* (2013.01); *H01L 2224/13139* (2013.01); *H01L 2224/13144* (2013.01); *H01L 2224/13147* (2013.01); *H01L 2224/16145* (2013.01); *H01L 2224/16227* (2013.01); *H01L 2224/1703* (2013.01); *H01L 2224/17181* (2013.01); *H01L 2224/32145* (2013.01); *H01L 2224/32225* (2013.01); *H01L 2224/73204* (2013.01); *H01L 2224/81815* (2013.01); *H01L 2224/92125* (2013.01); *H01L 2225/06513* (2013.01); *H01L 2225/06517* (2013.01); *H01L 2225/06555* (2013.01); *H01L 2924/1431* (2013.01); *H01L 2924/1434* (2013.01); *H01L 2924/1461* (2013.01); *H01L 2924/15313* (2013.01)

(58) Field of Classification Search
CPC ............................................. H01L 2924/15151
USPC .......................................................... 438/117
See application file for complete search history.

(56) References Cited

U.S. PATENT DOCUMENTS

| | | | | |
|---|---|---|---|---|
| 2002/0185748 | A1* | 12/2002 | Akram et al. | 257/778 |
| 2005/0253281 | A1* | 11/2005 | Odegard et al. | 257/783 |
| 2008/0216917 | A1* | 9/2008 | Takeuchi | 141/275 |
| 2013/0193612 | A1* | 8/2013 | Watabe | 264/261 |

* cited by examiner

*Primary Examiner* — Daniel Whalen
(74) *Attorney, Agent, or Firm* — Slater Matsil, LLP

(57) ABSTRACT

Chip packages and methods of manufacture thereof are described. In an embodiment, a method for manufacturing a chip package may include: providing a support structure including: a base; and a stage pivotably attached to the base, the stage having a surface facing away from the base; attaching a first die having at least one second die disposed thereon to the surface of the stage; pivotably tilting the stage; and after the pivotably tilting, dispensing an underfill over the first die and adjacent to the least one second die, the underfill flowing through a first standoff gap disposed between the first die and the at least one second die.

20 Claims, 15 Drawing Sheets

CHIP PACKAGES AND METHODS OF MANUFACTURE THEREOF

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required. An additional limit comes from the significant increase in the number and length of interconnections between devices as the number of devices increases. When the number and length of interconnections increase, both circuit RC delay and power consumption increase.

Three-dimensional (3D) integrated circuits (ICs) help to resolve the above-discussed limitations. Technologies in 3D IC include wafer-on-wafer, die-on-wafer and die-on-die. In a typical formation process of wafer-on-wafer 3D IC, a plurality of wafers, each including an integrated circuit, are formed. The wafers are then bonded with the devices aligned. Much higher device density has been achieved using 3D IC technology. Accordingly, 3D IC technology has the potential of being the mainstream technology of the next generation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
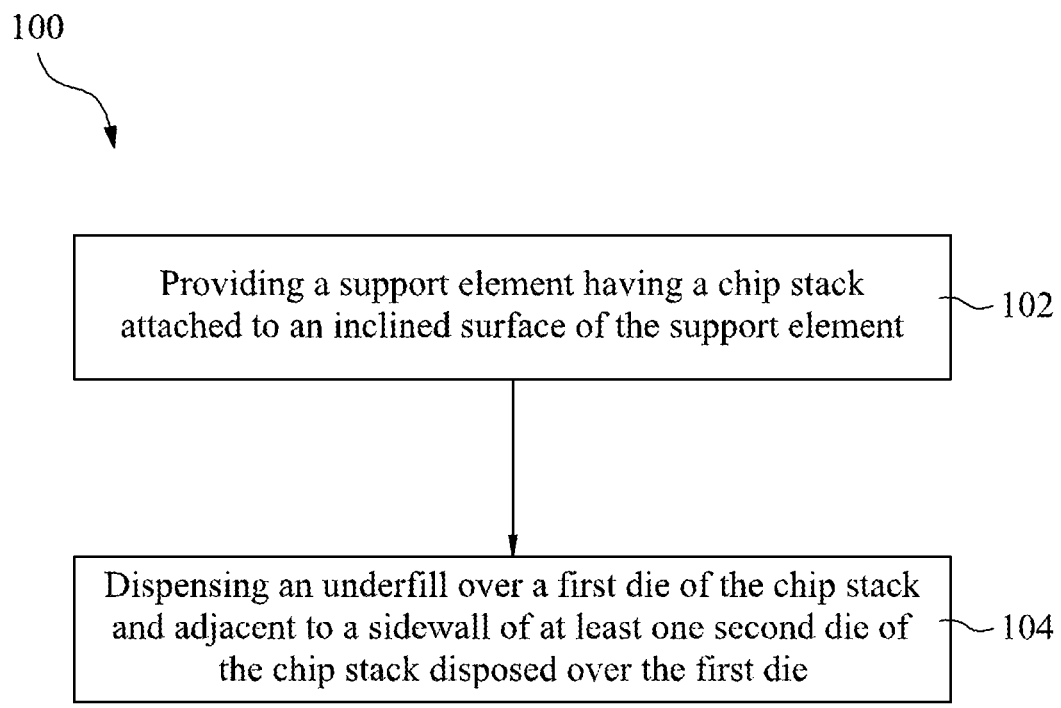
FIG. 1 shows a method for manufacturing a chip package, in accordance with some embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a method 100 for manufacturing a chip package, in accordance with one or more embodiments. The method 100 may include: providing a support element having a chip stack attached to an inclined surface of the support element (in 102); dispensing an underfill over a first die of the chip stack and adjacent to a sidewall of at least one second die of the chip stack disposed over the first die (in 104).

FIGS. 2A to 2G show a process flow illustrating the method 100 shown in FIG. 1, in accordance with one or more embodiments. The process flow shown in FIG. 2A to FIG. 2G may, for example, be an intermediate stage of manufacture of a chip package. The description that follows describes the method 100 in the context of manufacturing a die-on-die 3D chip package. However, it may be noted that the method 100 may analogously be applied to the manufacture of other 3D chip packages, such as a wafer-on-wafer 3D chip package and a die-on-wafer 3D chip package.

Figure 2A:
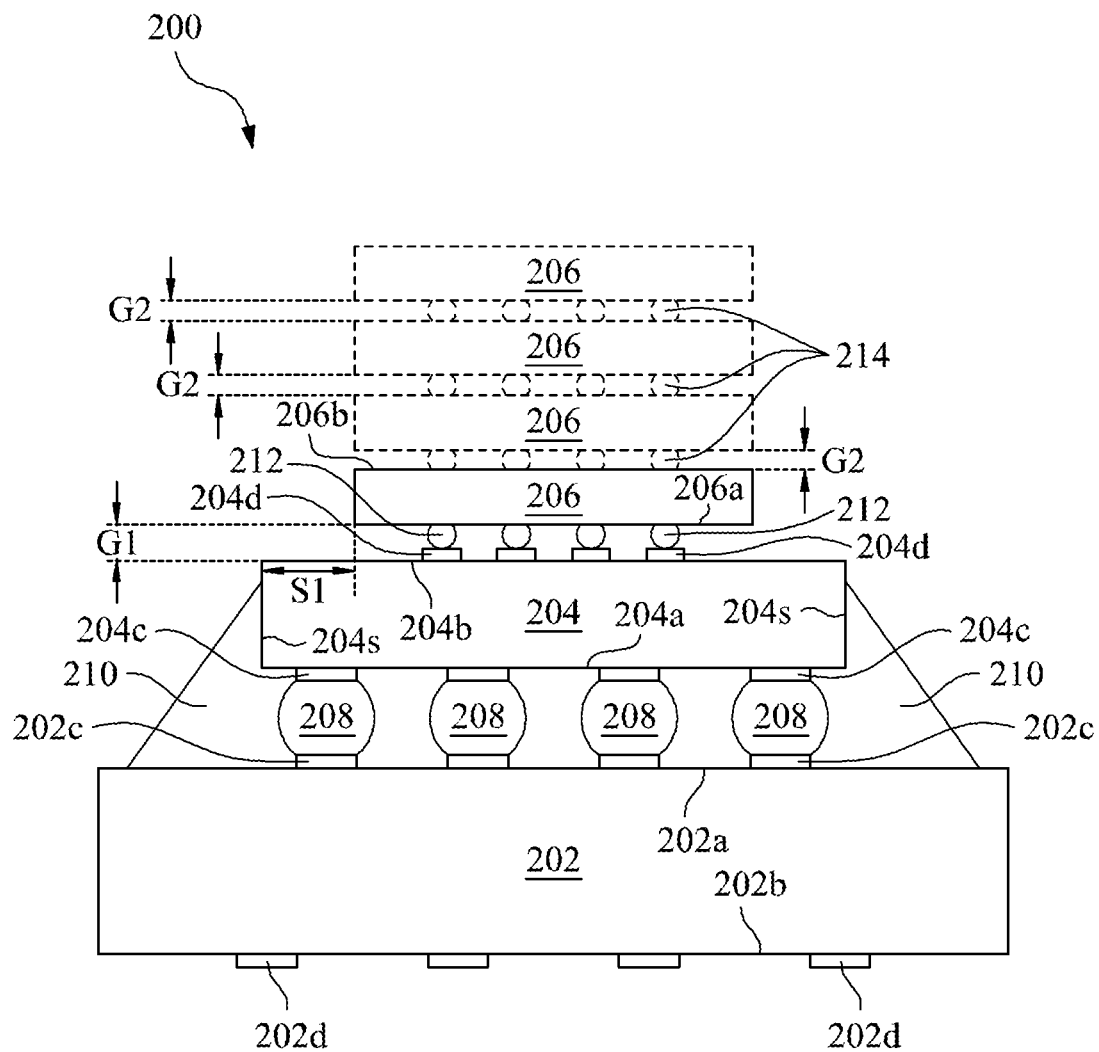
FIGS. 2A to 2G show a process flow illustrating the method shown in FIG. 1, in accordance with some embodiments.

FIG. 2A shows a chip stack 200, which may include a substrate 202, a first die 204, and at least one second die 206. The first die 204 may be disposed over (e.g. stacked over) the substrate 202, and the at least one second die 206 may be disposed over (e.g. stacked over) the first die 202. In an embodiment, the substrate 202 may include a semiconductor substrate. The semiconductor substrate may include an elementary semiconductor (e.g. including silicon and/or germanium in crystal), a compound semiconductor (e.g. including at least one of silicon carbide, gallium arsenic, gallium phosphide, indium phosphide, indium arsenide, or indium antimonide), an alloy semiconductor (e.g. including at least one of SiGe, GaAsP, AlInAs, AlGaAs, GaInAs, GaInP, or GaInAsP), or combinations thereof.

In another embodiment, the substrate 202 may include a customer board, a printed circuit board, or an interposer board that may, for example, be used in an end-user application. In such an embodiment, the substrate 202 may be formed by a lamination or pressing process, although other methods of forming the substrate 202 may be possible as well. As an example of this embodiment, the substrate 202 may include a laminate material. By way of another example of this embodiment, the substrate 202 may include an epoxy polymer containing a filler material (e.g. glass fiber). By way of yet another example, the substrate 202 may include FR4 and/or bis-maleimidetriazine (BT). By way of a further example of this embodiment, the substrate 202 may include an organic resin and/or a ceramic material.

The substrate 202 may have a first side 202a and a second side 202b opposite the first side 202a. As an example, the first side 202a and the second side 202b of the substrate 202 may be a top side and a bottom side of the substrate 202, respectively. The substrate 202 may include a plurality of contact pads 202c formed at the first side 202a of the substrate 202. In the example of FIG. 2A, the plurality of contact pads 202c are shown as being disposed atop the first side 202a of the substrate 202. However, in another embodiment, the plurality of contact pads 202c may be substantially co-planar with the first side 202a of the substrate 202. Only four contact pads 202c are shown as an example, however, the number of contact pads 202c may be less than four (e.g. one, two, or three) or may be more than four (e.g. five, six, seven, or more), in accordance with some embodiments. The substrate 202 may additionally include a plurality of contact pads 202d that may be formed at the second side 202b of the substrate 202. In the example of FIG. 2A, the plurality of contact pads 202d are shown as being disposed atop the second side 202b of the substrate 202. However, in another embodiment, the plurality of contact pads 202d may be substantially co-planar with the second side 202b of the substrate 202. Only four contact pads 202d are shown as an example, however, the number of contact pads 202d may be less than four (e.g. one, two, or three) or may be more than four (e.g. five, six, seven, or more), in accordance with some embodiments. The plurality of contact pads 202c and 202d of the substrate 202 may include an electrically conductive material (e.g. including copper or an alloy thereof). Methods of forming contact pads on a substrate are known in the art and are not described here for the sake of brevity.

The substrate 202 may include a redistribution layer (RDL) (not shown in FIG. 2A) or at least one via (also not shown in FIG. 2A). The RDL and/or the at least one via of the substrate 202 may be partially or fully disposed within (e.g. partially or fully embedded within) the substrate 202. The RDL or the at least one via of the substrate 202 may redistribute and/or re-map electrical connections from the plurality of contacts 202c at the first side 202a of the substrate 202 to the plurality of contacts 202d at the second side 202b of the substrate 202. The substrate 202 may include at least one circuit component (not shown in FIG. 2A) that may, for example, be embedded within the substrate 202. The at least one circuit component may include a passive circuit component (e.g. a resistor, capacitor, inductor) and/or an active circuit component (e.g. a transistor or another chip).

The chip stack 200 may include the first die 204, which may be disposed over (e.g. stacked over) the substrate 202. The first die 204 may be a die that may have been singulated from a wafer including a plurality of chips. The first die 204 may be used in one or more applications. For example, in an embodiment, the first die 204 may be used in microelectromechanical systems (MEMS), logic, memory, power or communications applications, although other applications may be possible as well in accordance with other embodiments. As an example, in a logic and memory application, the first die 204 may include a logic chip.

The first die 204 may have a first surface 204a and a second surface 204b opposite the first surface 204a. The first surface 204a of the first die 204 may face the first side 202a of the substrate 202, as shown in FIG. 2A. The first die 204 may include a plurality of contact pads 204c formed at the first surface 204a. In the example of FIG. 2A, the plurality of contact pads 204c are shown as being disposed atop the first surface 204a of the first die 204. However, in another embodiment, the plurality of contact pads 204c may be substantially co-planar with the first surface 204a of the first die 204. Only four contact pads 204c are shown as an example, however, the number of contact pads 204c may be less than four (e.g. one, two, or three) or may be more than four (e.g. five, six, seven, or more), in accordance with some embodiments. The first die 204 may additionally include a plurality of contact pads 204d formed at the second surface 204b. In the example of FIG. 2A, the plurality of contact pads 204d are shown as being disposed atop the second surface 204b of the first die 204. However, in another embodiment, the plurality of contact pads 204d may be substantially co-planar with the second surface 204b of the first die 204. Only four contact pads 204d are shown as an example, however, the number of contact pads 204d may be less than four (e.g. one, two, or three) or may be more than four (e.g. five, six, seven, or more), in accordance with some embodiments. The plurality of contact pads 204c and 204d may include an electrically conductive material (e.g. including copper or an alloy thereof). Methods of forming contact pads on a surface of a chip are known in the art and are not described here for the sake of brevity. In an embodiment, the plurality of pads 204c at the first surface 204a of the first die 204 may be electrically connected to the plurality of pads 204d at the second surface 204b of the first die 204 by a plurality of vias (not shown in FIG. 2A) disposed within (e.g. embedded within) the first die 204.

The first die 204 may additionally include passivation layers, dielectric layers, and under bump metallization (UBM) layers formed at the first surface 204a and/or second surface 204b of the first die 204. These features of the first die 204 are not shown in FIG. 2A for the sake of simplicity. The passivation layers, dielectric layers, and UBM layers may, for example, be disposed over at least a portion of the first surface 204a, the second surface 204b, and the plurality of contact pads 204c and 204d of the first die 204.

As shown in FIG. 2A, the chip stack 200 may include a plurality of first connectors 208 that may be disposed between the first surface 204a of the first die 204 and the first side 202a of the substrate 202. Only four first connectors 208 are shown as an example, however, the number of first connectors 208 may be less than four (e.g. one, two, or three) or more than four (e.g. five, six, seven, or more) in accordance with some embodiments. The plurality of first connectors 208 may electrically and mechanically connect the first die 204 and the substrate 202 to each other. For example, the plurality of first connectors 208 may electrically and mechanically connect the plurality of contact pads 202c of the substrate 202 and the plurality of contact pads 204c of the first die 204 to each other, as shown in FIG. 2A. In an embodiment, the plurality of first connectors 208 may include controlled collapse chip connection (C4) bumps. In the example shown in FIG. 2A, the plurality of first connectors 208 have a spherical shape (e.g. balls). However, in another embodiment the plurality of first connectors 208 may have another shape, e.g. pillars, posts, bumps, or caps.

The plurality of first connectors 208 may include an electrically conductive material (e.g. a metal or metal alloy). For example, the plurality of first connectors 208 may include a solder material. By way of another example, the plurality of first connectors 208 may include at least one of tin, lead, copper, gold, silver, zinc, bismuth, magnesium, antimony, indium or an alloy thereof. The plurality of first connectors 208 may be formed by a reflow process. For example, electrically conductive material may be deposited on the plurality of contact pads 202c of the substrate 202, and the first die 204 may be mounted face-down on the electrically conductive material deposited on the substrate 202 (e.g. in a flip-chip arrangement). The reflow process may subsequently be performed on the deposited electrically conductive material to form the plurality of first connectors 208 that electrically and mechanically connects the substrate 202 and the first die 204 to each other.

The chip stack 200 may include an underfill layer 210 that may be disposed between the first die 204 and the substrate 202. The underfill layer 210 may additionally be disposed at one or more sidewalls 204s of the first die 204. The underfill layer 210 may enclose (e.g. surround or encapsulate) the plurality of first connectors 208. The underfill layer 210 may additionally surround or encapsulate the first die 204, as shown in FIG. 2A. The underfill layer 210 may include an insulating material, which may, for example, include at least one of an epoxy material, a polyurethane material or an epoxy blend including two or more epoxy materials. The underfill layer 210 may be filled with filler particles, such as silica filler, glass filler or similar fillers. In an embodiment, the underfill layer 210 may include a molding compound.

The underfill layer 210 may be formed by dispensing one or more of the above-identified materials at one or more sidewalls 204s of the first die 204, sometimes in multiple (e.g. two or more) dispense passes. The dispensed material may subsequently flow via capillary action in a space between the first die 204 and the substrate 202 and in so doing, encapsulate the plurality of first connectors 208. The material may be subsequently cured (e.g. by a conduction, convection, laser, radio-frequency, or infrared heating process) to form the underfill layer 210.

The chip stack 200 may include the at least one second die 206, which may be disposed over (e.g. stacked over) the first die 204. The at least one second die 206 may be a die that may have been singulated from a wafer including a plurality of chips. The at least one second die 206 may be used in one or more applications, such as the examples stated above in respect of the first die 204. As an example, in a logic and memory application, the at least one second die 206 may include a memory chip.

The at least one second die 206 may have a first surface 206a and a second surface 206b opposite the first surface 206a. The first surface 206a of the at least one second die 206 may face the first surface 204a of the first die 204, as shown in FIG. 2A. The at least one second die 206 may include a plurality of contact pads (not shown in FIG. 2A) formed at the first surface 206a and/or the second surface 206b. The plurality of contact pads may include an electrically conductive material (e.g. including copper or an alloy thereof). Methods of forming contact pads on a surface of a chip are known in the art and are not described here for the sake of brevity. In an embodiment, the plurality of pads at the first surface 206a of the at least one second die 206 may be electrically connected to the plurality of pads at the second surface 206b of the at least one second die 206 by a plurality of vias (not shown in FIG. 2A) disposed within (e.g. embedded within) the at least one second die 206.

The at least one second die 206 may additionally include passivation layers, dielectric layers, and under bump metallization (UBM) layers formed at the first surface 206a and/or second surface 206b of the at least one second die 206. These features of the at least one second die 206 are not shown in FIG. 2A for the sake of simplicity. The passivation layers, dielectric layers, and UBM layers may, for example, be disposed over at least a portion of the first surface 206a, the second surface 206b, and the plurality of contact pads of the at least one second die 206.

As shown in FIG. 2A, the chip stack 200 may include a plurality of second connectors 212 that may be disposed between the first surface 206a of the at least one second die 206 and the second surface 204b of the first die 204. Only four second connectors 212 are shown as an example, however, the number of second connectors 212 may be less than four (e.g. one, two, or three) or more than four (e.g. five, six, seven, or more) in accordance with some embodiments. The plurality of second connectors 212 may electrically and mechanically connect the at least one second die 206 and the first die 206 to each other. For example, the plurality of second connectors 212 may electrically and mechanically connect the plurality of contact pads 204d of the first die 204 and the at least one second die 206 to each other, as shown in FIG. 2A. In an embodiment, the plurality of second connectors 212 may include controlled collapse chip connection (C4) bumps. In the example shown in FIG. 2A, the plurality of second connectors 212 have a spherical shape (e.g. balls). However, in another embodiment the plurality of second connectors 212 may have another shape, e.g. pillars, posts, bumps, or caps.

The plurality of second connectors 212 may include similar materials as the plurality of first connectors 208. The plurality of second connectors 212 may be formed by a similar process as the plurality of first connectors 208. For example, electrically conductive material may be deposited on the plurality of contact pads 204d of the first die 204, and the at least one second die 206 may be mounted face-down on the electrically conductive material deposited on the first die 206 (e.g. in a flip-chip arrangement). A reflow process may subsequently be performed on the deposited electrically conductive material to form the plurality of second connectors 212 that electrically and mechanically connects the at least one second die 206 and the first die 204 to each other.

As shown in FIG. 2A, there may be a first standoff gap G1 between the first die 204 and the at least one second die 206. The first standoff gap G1 may be a gap (e.g. an air gap) or a space between the second surface 204b of the first die 204 and the first surface 206a of the at least one second die 206, and may be formed as a result of the plurality of second connectors 212 being disposed between the first die 204 and the at least one second die 206.

In some embodiments, as in the example shown in FIG. 2A, the at least one second die 206 may include a plurality of vertically stacked second dies 206. Only four vertically stacked second dies 206 are shown in the example of FIG. 2A, however, the number of vertically stacked second dies 206 disposed over (e.g. vertically stacked over) the first die 204 may be less than four (e.g. two or three) or may be more than four (e.g. five, six, seven, or more), in accordance with other embodiments. In the embodiment where the at least one second die 206 includes the plurality of vertically stacked second dies 206, the first die 204 may have a multi-layer chip stack disposed over the second surface 204b of the first die 204. In such an embodiment, the first die 204 may be electrically and/or communicatively connected to the plurality of vertically stacked second dies 206 by the plurality of vias (not shown in FIG. 2A) formed in the plurality of vertically stacked second dies 206.

The plurality of vertically stacked second dies 206 may also be electrically connected to each other by a plurality of third connectors 214, which may disposed between immediately adjacent second dies 206 (e.g. a second die 206 immediately above or immediate below another second die 206). In an embodiment, the plurality of third connectors 214 may include controlled collapse chip connection (C4) bumps. In the example shown in FIG. 2A, the plurality of third connectors 214 have a spherical shape (e.g. balls). However, in another embodiment the plurality of third connectors 214 may have another shape, e.g. pillars, posts, bumps, or caps.

The plurality of third connectors 214 may include similar materials as the plurality of first connectors 208. The plurality of third connectors 214 may be formed by a similar process as the plurality of first connectors 208. For example, electrically conductive material may be deposited on a plurality of contact pads that may be disposed at the second surface 206b of a lower second die 206, and another second die 206 may be mounted face-down on the electrically conductive material deposited on the lower second die 206 (e.g. in a flip-chip arrangement). A reflow process may subsequently be performed on the deposited electrically conductive material to form the plurality of third connectors 214 that electrically and mechanically connects the plurality of vertically stacked second dies 206 to each other.

As shown in FIG. 2A, in the embodiment where the at least one second die 206 includes the plurality of vertically stacked second dies 206, there may be a second standoff gap G2 between immediately adjacent second dies 206. The second standoff gap G2 may be a gap (e.g. an air gap) or a space between the first surface 206a of a second die 204 and the second surface 206b of an immediately adjacent second die 204, and may be formed as a result of the plurality of third connectors 214 being disposed between immediately adjacent second dies.

In subsequent process flow steps, the first standoff gap G1 is filled with an underfill. Furthermore, in the embodiment where the at least one second die 206 includes the plurality of vertically stacked second dies 206 (as in the example shown in FIG. 2A), the second standoff gaps G2 are also filled with the underfill.

Figure 2B:
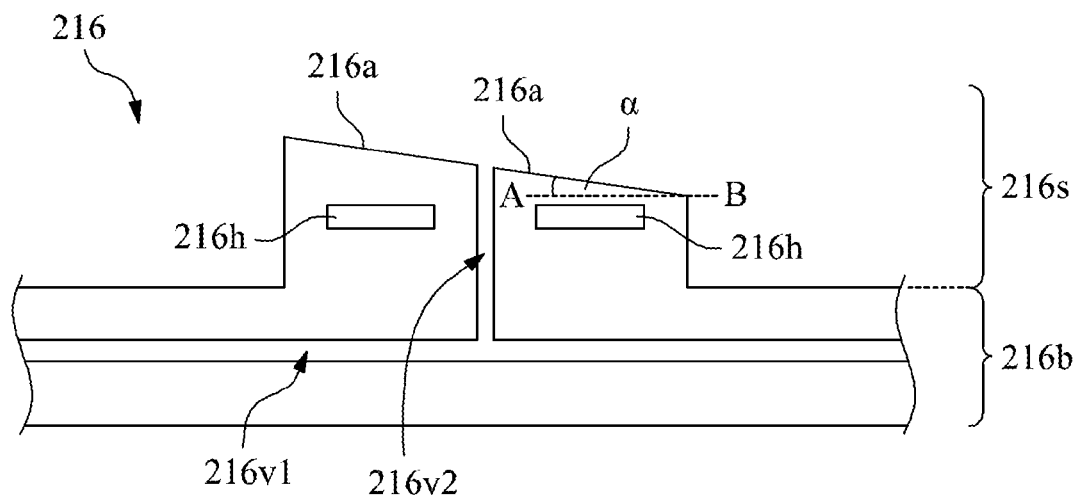

FIG. 2B shows a cross-sectional view of a static support structure 216 upon which the chip stack 200 (see FIG. 2A) may be placed while the underfill is dispensed to fill the first standoff gap G1 and the second standoff gaps G2 of the chip stack 200. The static support structure 216 may include tool stage, a die chuck, or a wafer chuck suitable for use during an underfill dispensing process. As shown in FIG. 2B, the static support structure 216 may include a base 216b and a stage 216s disposed over the base 216b. The stage 216s of the static support structure 216 may have an inclined surface 216a upon which the chip stack 200 may be placed (see description below in respect of FIG. 2C). An incline angle α subtended between the inclined surface 216a of the static support structure 216 and a horizontal axis A-B may be in a range from about 15 degrees to about 75 degrees, e.g. about 60 degrees, although other angles may be possible as well in accordance with other embodiments.

The static support structure 216 may include a first vacuum channel 216v1 and a second vacuum channel 216v2. The first vacuum channel 216v1 may be formed within the base 216b, and may extend laterally across the base 216b of the static support structure 216, as shown in the example of FIG. 2B. The second vacuum channel 216v2 may be formed within the stage 216s, and may be connected to the first vacuum channel 216v1. For example, as shown in FIG. 2B, the second vacuum channel 216v2 may extend from the inclined surface 216a of the static support structure 216 to the first vacuum channel 216v1. The static support structure 216 may include a heating element 216h, which may be disposed in the stage 216s of the static support structure 216. The heating element 216h may, for example, heat the underfill that is subsequently dispensed while the chip stack 200 is disposed on the inclined surface 216a of the static support structure 216.

Figure 3:
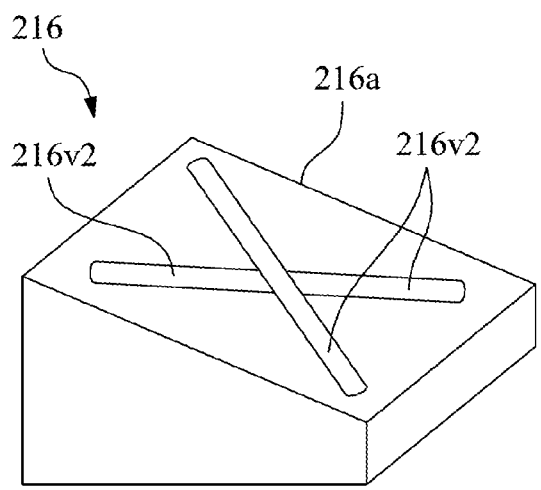
FIG. 3 shows a perspective view of a static support structure, in accordance with some embodiments.

A perspective view of the static support structure 216 in FIG. 2B is shown in FIG. 3. As described above, the second vacuum channel 216v2 may extend from the inclined surface 216a of the static support structure 216 to the first vacuum channel 216v1. Furthermore, as shown in FIG. 3, the portion of the second vacuum channel 216v2 at the inclined surface 216a of the static support structure 216 may additionally extend laterally across the inclined surface 216a of the static support structure 216. This may result in a greater contact area between the second vacuum channel 216v2 and the chip stack 200 (see FIG. 2A) that is subsequently placed on the inclined surface 216a of the static support structure 216. This may, consequently, result in a more secure attachment of the chip stack 200 to the inclined surface 216a of the static support structure.

Figure 2C:
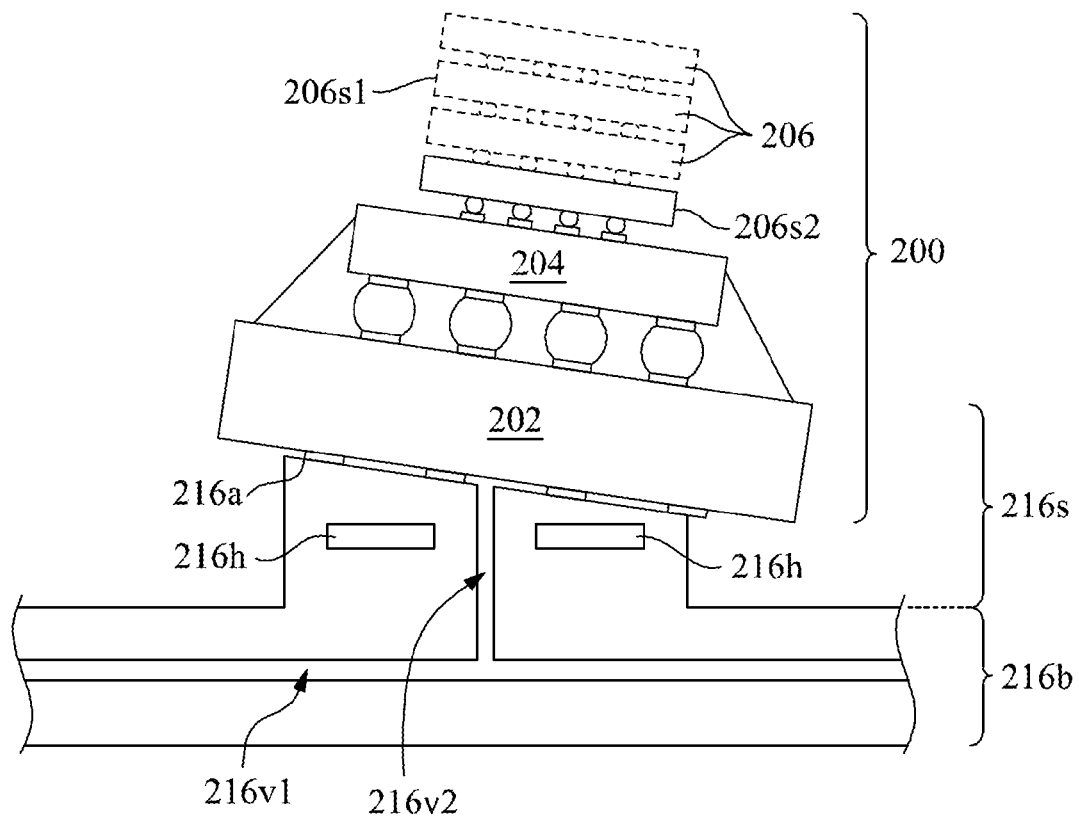

As shown in FIG. 2C, the chip stack 200 may be picked and placed on the inclined surface 216a of the support structure 216. The chip stack 200 may be held in place on the inclined surface 216a of the support structure 216 by a suction force created at the inclined surface 216a. The suction force may be created by applying a low pressure or a vacuum to the first vacuum channel 216v1 and the second vacuum channel 216v2 using, for example, a pump (not shown in FIG. 2B), which may evacuate air in the first vacuum channel 216v1 and the second vacuum channel 216v2. As shown in FIG. 2C, the at least one second chip 206 may have a first sidewall 206s1 and a second sidewall 206s2 opposite the first sidewall 206s1. The first sidewall 206s1 of the at least one second chip 206 may be disposed higher on the inclined surface 216a of the static support structure 216 than the second sidewall 206s2.

Figure 2D:
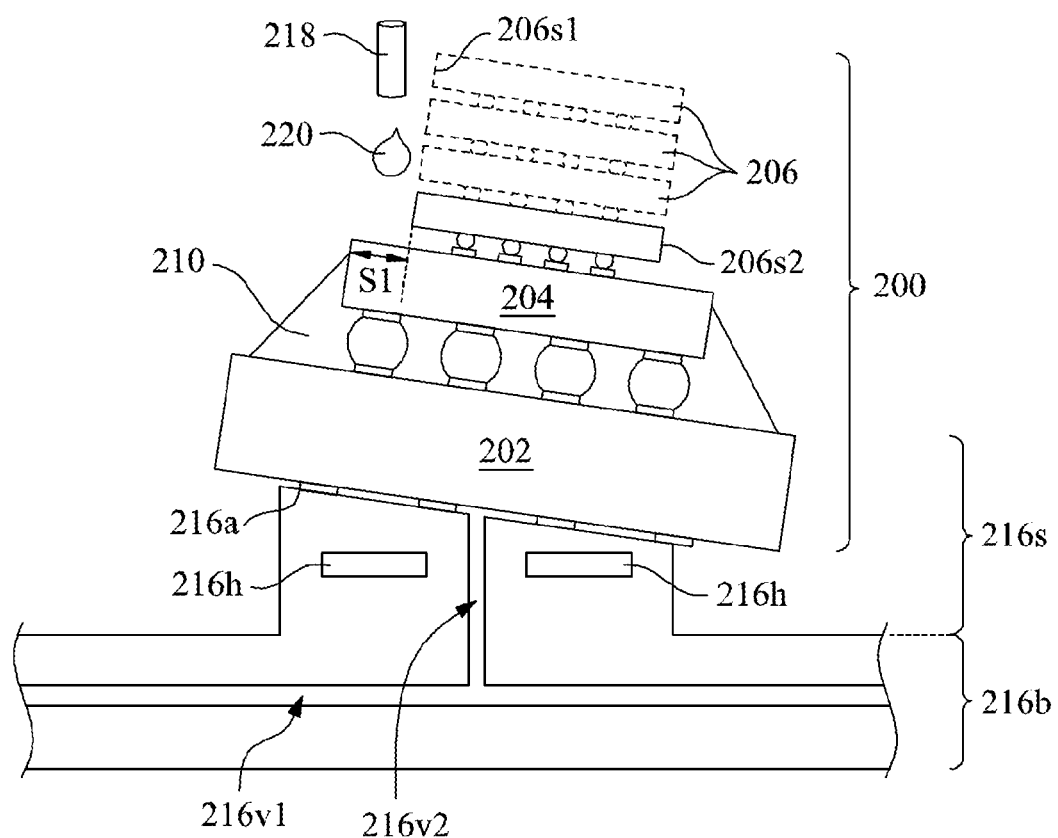

Referring to FIG. 2D, a dispenser head 218 may be positioned adjacent to the first sidewall 206s1 of the at least one second chip 206. An underfill 220 may be dispensed from the dispenser head 218 (e.g. by means of a jetting process) over the first die 204 and adjacent to the first sidewall 206s1 of the at least one second die 206. The underfill 220 may include similar materials as the underfill layer 210. The underfill 220 may be dispensed in multiple (e.g. two or more) dispense passes. Subsequently, the underfill 220 flows, under the influence of gravity, through the first standoff gap G1 from the first sidewall 206s1 to the second sidewall 206s2 of the at least one second die 206. In the embodiment where the at least one second die 206 includes the plurality of vertically stacked second dies 206, the underfill 220 additionally flows, under the influence of gravity, through the second standoff gaps G2 from the first sidewall 206s1 to the second sidewall 206s2 of the at least one second die 206. It is noted that in the embodiment where the at least one second die 206 includes the plurality of vertically stacked second dies 206, the underfill 220 is dispensed after the plurality of vertically stacked second dies 206 is placed on the first die 204. Consequently, the underfill 220 fills the first standoff gap G1 and the second standoff gap G2 simultaneously. The heating element 216h may be used to heat the underfill 220 as it flows from the first sidewall 206s1 to the second sidewall 206s2 of the at least one second die 206.

Figure 2E:
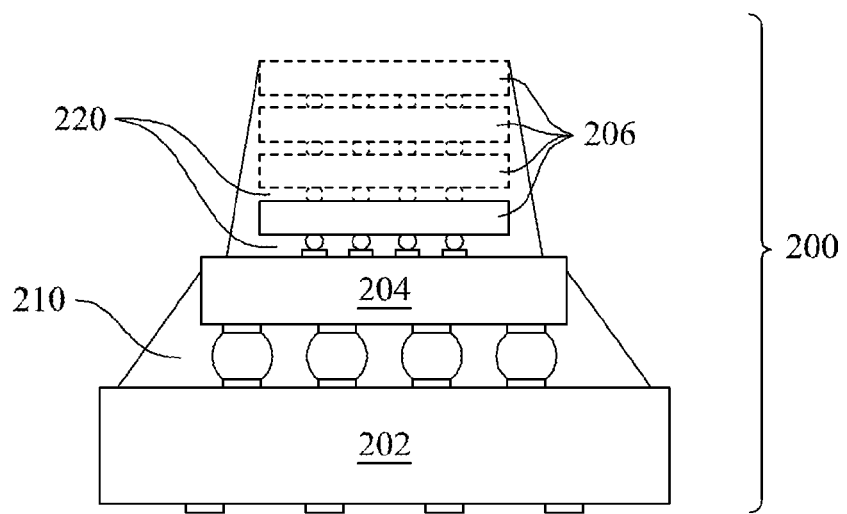
Figure 2F:
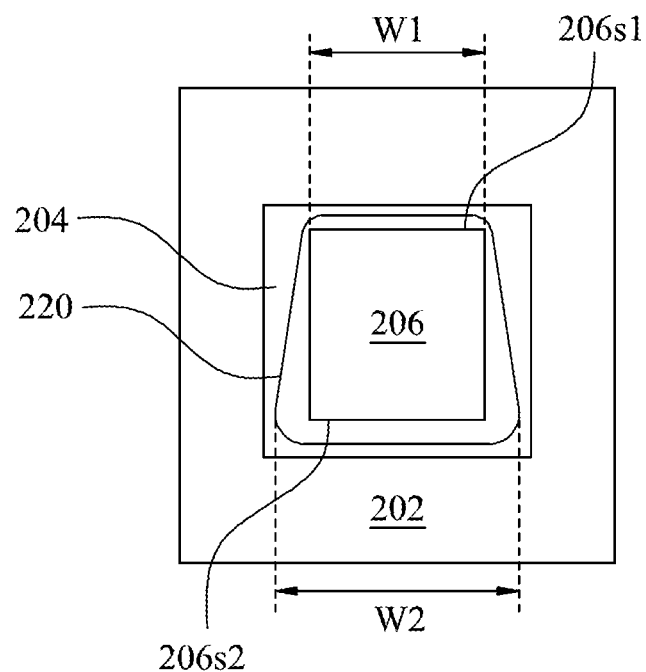

Referring to FIG. 2E, after the underfill 220 has sufficiently flowed to encapsulate the at least one second die 206 and fill the first standoff gap G1 and the second standoff gaps G2, the chip stack 200 may be removed from the static support structure 216. FIG. 2F shows a plan view of the chip stack 200 shown in FIG. 2E. As shown in FIG. 2F, the underfill 220 is disposed over the first die 204 and surrounds the at least one second die 206. However, the underfill 220 does not bleed into the substrate 202. In other words, the underfill 220 is disposed within a lateral extent of the first die 204. As a consequence of the underfill 220 being dispensed at the first sidewall 206s1 of the at least one second die 206 while the chip stack 200 is disposed on the inclined surface 216a of the support structure 216s, a width W2 of the underfill 220 proximal the second sidewall 206s2 of the at least one second die 206 may be larger than a width W1 of the underfill 220 proximal the first sidewall 206s1 of the at least one second die 206. For example, the width W2 may be about 5 percent to about 30 percent larger (e.g. about 20 percent larger) than the width W1. Furthermore, the increase in the width of the underfill 220 from width W1 to a width W2 may be smooth and gradual. In general, the widths W1 and W2 may depend at least in part on the volume of underfill 220 dispensed, the composition of the underfill 220 (which may affect its viscosity), and the thicknesses of the first die 204 and the at least one second die 206.

Figure 2G:
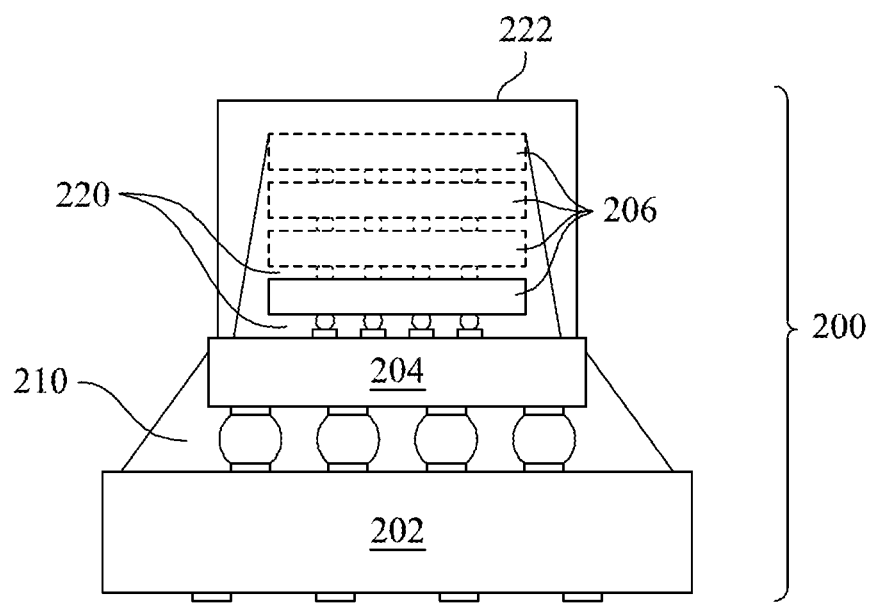

An advantage provided by the process flow described above includes simultaneous filling of the first standoff gap G1 and the second standoff gaps G2 with the underfill 220, which may not be possible or adequately provided if the chip stack 200 is level or flat during the dispensing and flowing of the underfill 220. Furthermore, since the chip stack 200 is tilted during the dispensing and flowing of the underfill 220, the contact area made between the underfill 220 and a lateral portion of the second surface 204b of the first die 204 adjacent to the first sidewall 206s1 of the at least one second die 206 (labeled as S1 in FIG. 2A and FIG. 2D) is increased. The increased contact area between the underfill 220 and the lateral portion S1 of the second surface 204b of the first die 204 allows for greater control of the flow of the underfill 220 in the lateral portion S1 of the second surface 204b of the first die 204, which may not be possible or adequately provided if the chip stack 200 is level or flat during the dispensing and flowing of the underfill 220. The greater control of the flow of the underfill 220 in the lateral portion S1 of the second surface 204b of the first die 204 can, in turn, prevent bleeding of the underfill 220 onto the underfill layer 210 or onto the substrate 202. In an example where the underfill 220 is subsequently covered with a cap or a lid 222 (e.g. as shown in FIG. 2G), the absence of bleeding of the underfill 220 may allow provision of an air gap between the underfill 220 and the lid 222, which may be useful for preventing heat generated during operation or testing of the first die 204 (e.g. logic die) from being conducted through the lid 222 to the at least one second die 206. This may, in turn, prevent burn out (e.g. memory burn out) of the at least one second die 206. Additionally, the greater control of the flow of the underfill 220 also allows for the greater control of the widths W1 and W2 of the underfill 220 (e.g. as shown in FIG. 2F), which may not be possible or adequately provided if the chip stack 200 is level or flat during the dispensing and flowing of the underfill 220. For example, the flowing of the underfill 220 may be monitored and the chip stack 200 may be removed from the static support structure 216 as soon as the flowing underfill 220 reaches the second sidewall 206s2 of the at least one second die 206. Control of the widths W1 and W2 of the underfill 220 may allow for control of a width-to-depth ratio (e.g. W1:G1, W1:G2, W2:G1, or W2:G2) of the underfill 220.

In the static support structure 216 shown in the process flow of FIG. 2A to FIG. 2G, the incline angle α subtended between the inclined surface 216a of the support structure 216 and the horizontal axis A-B (shown in FIG. 2B) is fixed and may not be changed. In accordance with other embodiments, a movable support structure may be provided. The movable support structure may have a surface upon which the chip stack 200 is placed during the dispensing and flowing of the underfill 220, and the angle of incline of the surface of the movable support structure may be varied or changed. An embodiment of such a movable support structure is shown in FIG. 4A.

Figure 4A:
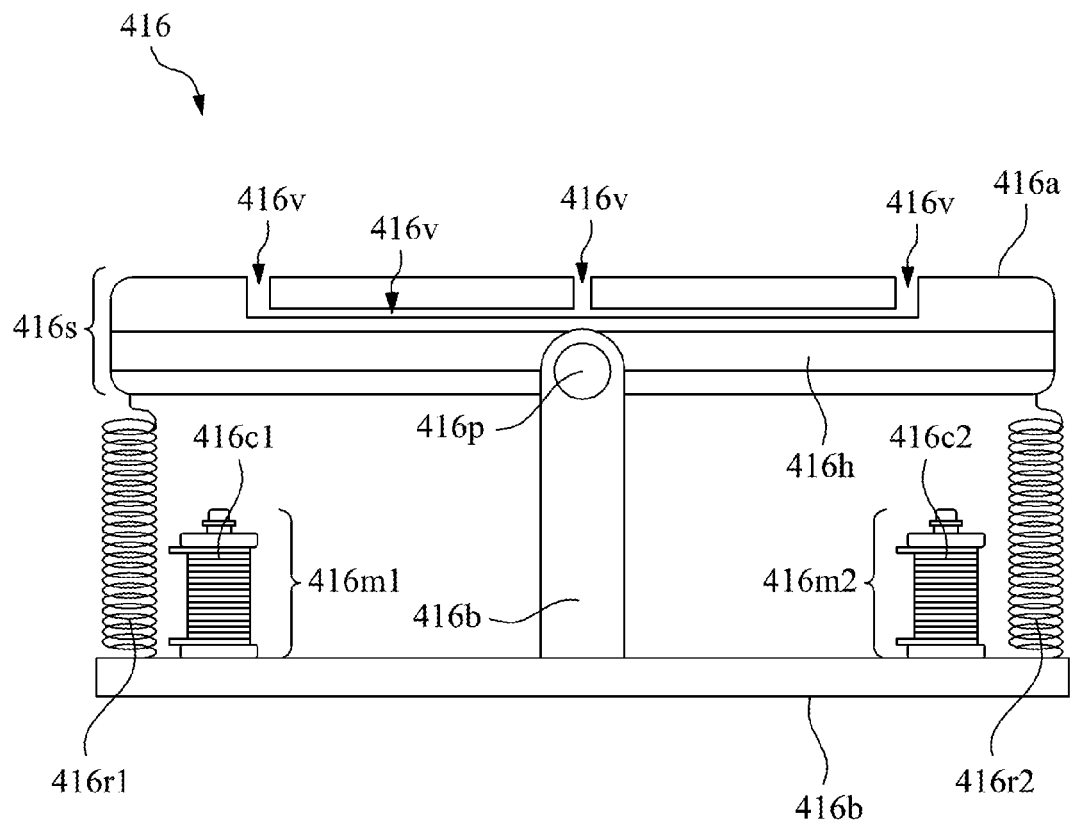
FIGS. 4A to 4C show another process flow illustrating the method shown in FIG. 1, in accordance with some embodiments.

FIG. 4A shows a cross-sectional view of a movable support structure 416 upon which the chip stack 200 is placed while the underfill 220 is dispensed to fill the first standoff gap G1 and the second standoff gaps G2 of the chip stack 200. As shown in FIG. 4A, the movable support structure 416 may include a base 416b and a stage 416s pivotably connected to the base 216b (e.g. by means of a pivot 416p). The stage 416s of the movable support structure 416 may have a surface 416a upon which the chip stack 200 may be placed. The support structure 416 may include vacuum channels 416v formed within the stage 416s, as shown in the example of FIG. 4A. The vacuum channels 416v may be used to secure the chip stack 200 to the movable support structure 416 (e.g. to the surface 416a of the movable support structure 416). The movable support structure 416 may include a heating element 416h, which may be disposed in the stage 216s of the support structure 216. The heating element 216h may, for example, heat the underfill 220 that is subsequently dispensed while the chip stack 200 is disposed on the first surface 416a of the support structure 416.

As shown in FIG. 4A, the movable support structure 416 may include a first magnet 416m1 disposed below the stage 416s and above the base 416b at a first lateral portion 416l1 of the base 416b. The movable support structure 416 may further include a second magnet 416m2 disposed below the stage 416s and above the base 416b at a second lateral portion 416l2 of the base 416b. The first magnet 416m1 and the second magnet 416m2 may include electromagnets. In the embodiment shown in FIG. 4A, the first magnet 416m1 and the second magnet 416m2 may provide a means for varying a tilt angle of the stage 416s and consequently, the incline angle of the surface 416a upon which the chip stack 200 is placed while the underfill 220 is dispensed to fill the first standoff gap G1 and the second standoff gaps G2 of the chip stack 200.

Figure 4B:
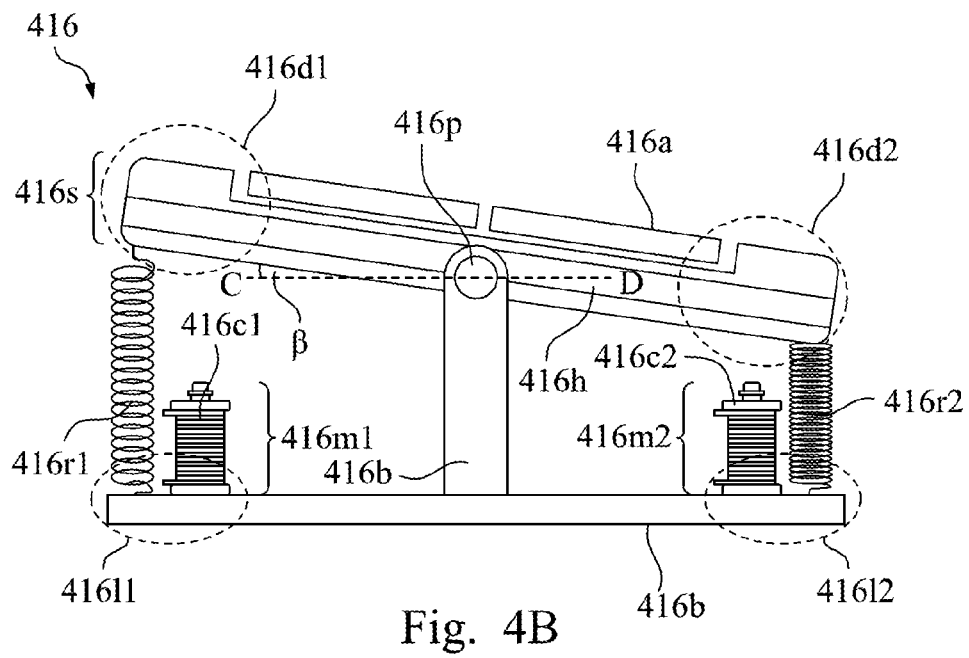

As an example, in the embodiment shown in FIG. 4B, the stage 416s may be pivotably tilted or rotated by passing a current through a coil 416c1 of the first magnet 416m1 and/or a coil 416c2 of the second magnet 416m2. As an example, a current may be passed through the coil 416c1 of the first magnet 416m1 to generate a repulsion force on a first lateral portion 416d1 of the stage 416s. Alternatively, or in addition, another current may be passed through the coil 416c2 of the second magnet 416m2 to exert an attraction force on a second lateral portion 416d2 of the stage 416s. Consequently, the stage 416s may be pivotably tilted or rotated about the pivot 416p. Since the currents passed through the coils 416c1 and 416c2 may generate magnetic fields that may exert the repulsion force and/or attraction force on the stage 416s, the stage 416s of the movable support structure 416 may include a metal or metal alloy.

As shown in FIG. 4A and FIG. 4B, the movable support structure 416 may include a first resilient structure 416r1 and a second resilient structure 416r2. As an example, the first resilient structure 416r1 and the second resilient structure 416r2 may include springs. A first end of the first resilient structure 416r1 may be attached to the first lateral portion 416l1 of the base 416b, and a second end of the first resilient structure 416r1 may be attached to the first lateral portion 416d1 of the stage 416s. In like manner, a first end of the second resilient structure 416r2 may be attached to the second lateral portion 416l2 of the base 416b, and a second end of the second resilient structure 416r2 may be attached to the second lateral portion 416d2 of the stage 416s. The first resilient structure 416r1 and the second resilient structure 416r2 may dampen or smoothen the motion of the stage 416s of the movable support structure 416 as it pivotably tilts or rotates about the pivot 416p. This may, consequently, allow for greater control of an incline angle β subtended between the surface 416a of the movable support structure 416 and a horizontal axis C-D. The incline angle β may be controlled by varying the magnitude of the repulsion force and/or attraction force exerted on the stage 416s. This may, in turn, be controlled by varying the current passed through the coils 416c1 and 416c2 of the first magnet 416m1 and the second magnet 416m2, respectively. The incline angle β may be in a range from about −75 degrees (e.g. when the second lateral portion 416d2 of the stage 416s is tilted higher than the first lateral portion 416d1) to about 75 degrees (e.g. when the first lateral portion 416d1 of the stage 416s is higher than the second lateral portion 416d2), although other angles may be possible as well in accordance with other embodiments.

Figure 4C:
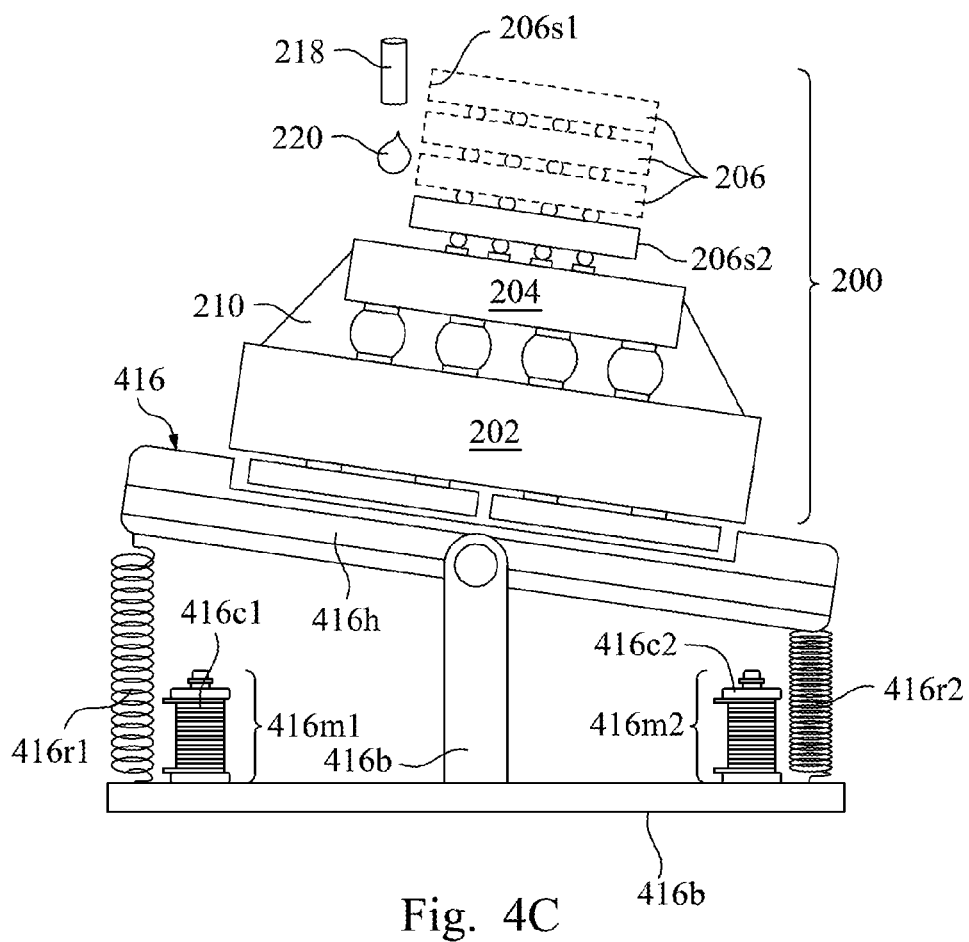

As shown in FIG. 4C, the chip stack 200 may be picked and placed on the surface 416a of the movable support structure 416. The chip stack 200 may held in place on the surface 416a of the movable support structure 416 by a suction force created at the surface 416a. The suction force may be created by applying a low pressure or a vacuum to the vacuum channels 416v using, for example, a pump (not shown in FIG. 4C), which may evacuate air in the vacuum channels 416v.

In an embodiment of FIG. 4C, the stage 416s of the support structure 416 is pivotably tilted based on a predetermined or pre-selected incline angle β prior to placing the chip stack 200 on and securing the chip stack 200 to the stage 416s of the movable support structure 416. However, in another embodiment of FIG. 4C, the chip stack 200 may be placed on and secured to the stage 416s while the surface 416a is level or flat (e.g. when the incline angle β is substantially zero). Subsequently, the stage 416s of the movable support structure 416 having the chip stack 200 attached thereto may be pivotably tilted to form the arrangement shown in FIG. 4C.

As shown in FIG. 4C, the dispenser head 218 may be positioned adjacent to the first sidewall 206s1 of the at least one second chip 206. The underfill 220 may be dispensed from the dispenser head 218 over the first die 204 and adjacent to the first sidewall 206s1 of the at least one second die 206. The underfill 220 may be dispensed in multiple (e.g. two or more) dispense passes. Subsequently, the underfill 220 flows, under the influence of gravity, through the first standoff gap G1 from the first sidewall 206s1 to the second sidewall 206s2 of the at least one second die 206. In the embodiment where the at least one second die 206 includes the plurality of vertically stacked second dies 206, the underfill 220 additionally flows, under the influence of gravity, through the second standoff gaps G2 from the first sidewall 206s1 to the second sidewall 206s2 of the at least one second die 206. The heating element 216h may be used to heat the underfill 220 as it flows from the first sidewall 206s1 to the second sidewall 206s2 of the at least one second die 206. After the underfill 220 has sufficiently flowed to fill the first standoff gap G1 and the second standoff gaps G2, the chip stack 200 may be removed from the movable support structure 416, and the resultant chip stack 200 may resemble the chip stack 200 shown in FIG. 2E.

In the process flow described in FIG. 4A to FIG. 4C, once the stage 416s of the movable support structure 416 is pivotably tilted (e.g. prior to or after attaching the chip stack 200 to the stage 416s), the stage 416s remains in position while the underfill 220 is dispensed and while the underfill 220 flows to fill the first standoff gap G1 and the second standoff gaps G2. In other words, the incline angle β does not vary during the dispensing and the flowing of the underfill 220. However, in another embodiment, the stage 416s of the movable support structure 416 may be pivotably tilted while the underfill 220 is dispensed and/or while the underfill 220 flows to fill the first standoff gap G1 and the second standoff gaps G2. In such an embodiment, the incline angle β may be varied during the dispensing and/or the flowing of the underfill 220. Varying the incline angle β in such a manner may enhance the flowing of the underfill 220 through the first standoff gap G1 and the second standoff gaps G2, e.g. in an embodiment where the incline angle β is increased during the dispensing and/or the flowing of the underfill 220. Varying the incline angle β in such a manner may also prevent overflow or bleeding of the underfill 220 onto the underfill layer 210 or onto the substrate 202, e.g. in an embodiment where the incline angle β is decreased after the underfill 220 flows through the first standoff gap G1 and the second standoff gaps G2.

An advantage provided by the process flow described above includes simultaneous filling of the first standoff gap G1 and the second standoff gaps G2 with the underfill 220, which may not be possible or adequately provided if the chip stack 200 is level or flat during the dispensing and flowing of the underfill 220. Furthermore, since the chip stack 200 is tilted during the dispensing and flowing of the underfill 220, the contact area made between the underfill 220 and the lateral portion of the second surface 204b of the first die 204 adjacent to the first sidewall 206s1 of the at least one second die 206 (labeled as S1 in FIG. 2A and FIG. 2D) is increased. The increased contact area between the underfill 220 and the lateral portion S1 of the second surface 204b of the first die 204 allows for greater control of the flow of the underfill 220 in the lateral portion S1 of the second surface 204b of the first die 204, which may not be possible or adequately provided if the chip stack 200 is level or flat during the dispensing and flowing of the underfill 220. The greater control of the flow of the underfill 220 in the lateral portion S1 of the second surface 204b of the first die 204 can, in turn, prevent bleeding of the underfill 220 onto the underfill layer 210 or onto the substrate 202. In an example where the at least one second chip 206 is subsequently covered with a cap or a lid 222 (e.g. as shown in FIG. 2G), the absence of bleeding of the underfill 220 may allow provision of an air gap between the underfill 220 and the lid 222, which may be useful for preventing heat generated during operation or testing of the first die 204 (e.g. logic die) from being conducted through the lid 222 to the at least one second die 206. This may, in turn, prevent burn out (e.g. memory burn out) of the at least one second die 206. Additionally, the greater control of the flow of the underfill 220 also allows for the greater control of the widths W1 and W2 of the underfill 220 (e.g. as shown in FIG. 2F), which may not be possible or adequately provided if the chip stack 200 is level or flat during the dispensing and flowing of the underfill 220. For example, the flowing of the underfill 220 may be monitored and the chip stack 200 may be removed from the movable support structure 416 as soon as the flowing underfill 220 reaches the second sidewall 206s2 of the at least one second die 206. Control of the widths W1 and W2 of the underfill 220 may allow for control of the width-to-depth ratio (e.g. W1:G1, W1:G2, W2:G1, or W2:G2) of the underfill 220.

While the examples shown in FIG. 2A to FIG. 2G and in FIG. 4A to FIG. 4C show the chip stack 200 having a chip-on-chip-on-substrate arrangement, other chip arrangements may be used with the static support structure 216 and/or the movable support structure 416. For example, the static support structure 216 and/or the movable support structure 416a may be used to flow the underfill 220 and fill a standoff gap in a traditional flip-chip arrangement (e.g. including the substrate 202 and the first chip 204) to form, for example, the underfill layer 210. By way of another example, the static support structure 216 and/or the movable support structure 416a may be used to flow the underfill 220 and fill a standoff gap between a top package and a bottom package in a package-on-package (PoP) arrangement. The PoP arrangement may, for example, be an integrated fan-out (InFO) PoP arrangement.

Furthermore, in the examples shown in FIG. 4A to FIG. 4C, the incline angle β is less than 90 degrees. However, in another embodiment of the movable support structure 416, the incline angle β may be substantially 90 degrees (e.g. see description below in respect of FIG. 5A to FIG. 5C). Additionally, in the examples shown in FIG. 4A to FIG. 4C, the incline angle β is controlled by the first magnet 416m1 and the second magnet 416m2 of the movable support structure 416. However, in another embodiment, the incline angle β may controlled by a motor (e.g. a stepper motor). For example, the motor may be mechanically connected to the stage 416s (e.g. at or near the pivot 416p), and the motor may tilt the stage 416s about the pivot 416p.

Figure 5A:
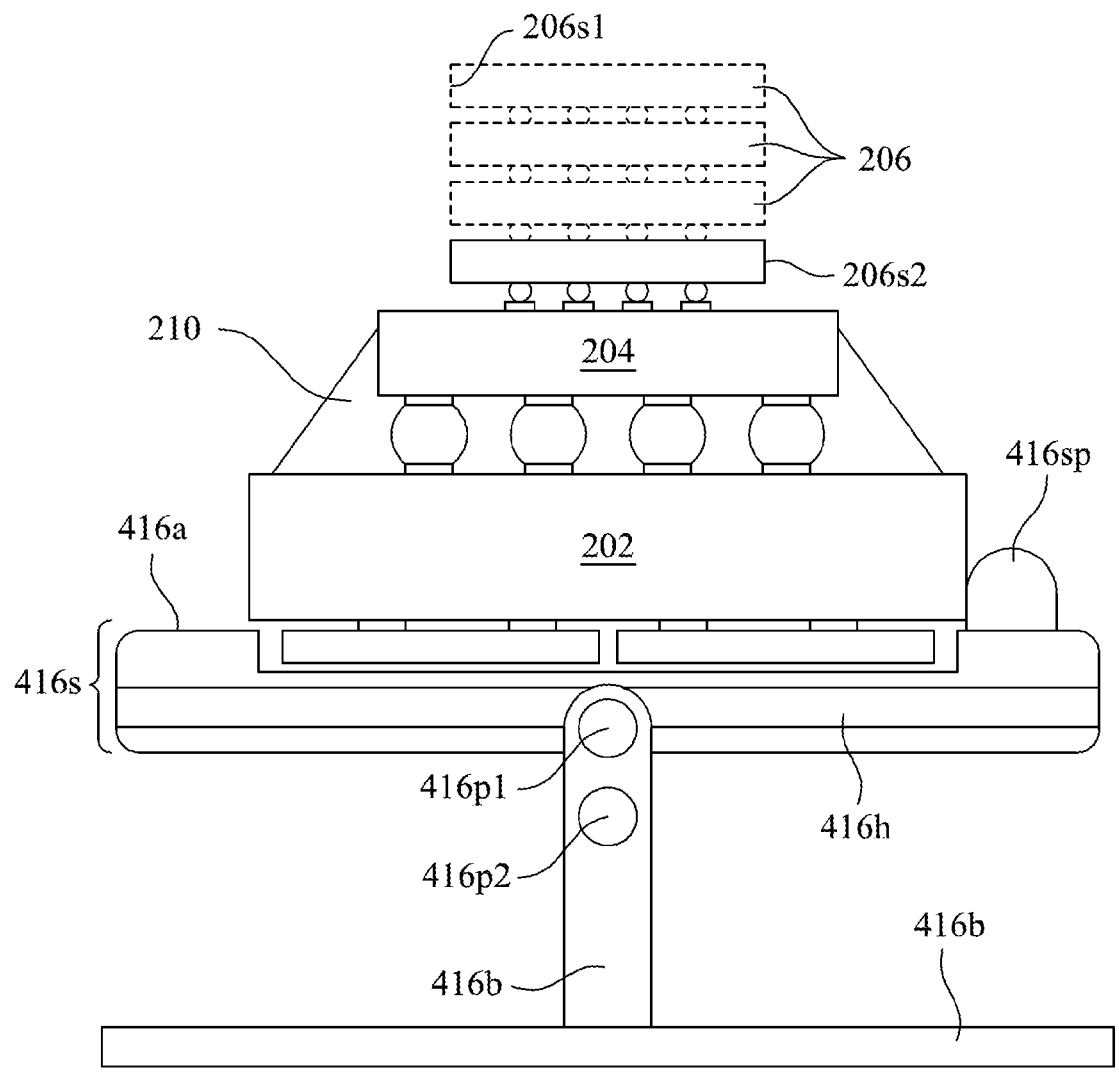
FIGS. 5A to 5C show yet another process flow illustrating the method shown in FIG. 1, in accordance with some embodiments.

FIG. 5A shows another embodiment of the movable support structure 416. In such an embodiment, the movable support structure 416 may include a stopper 416sp disposed on the surface 416a. When the chip stack 200 is placed on the surface 416a of the movable support structure 416, the stopper 416sp may be in contact with (e.g. direct physical contact with) a sidewall of the first die 202 of the chip stack 200, as shown in FIG. 5A. The movable support structure 416 may include a first pivot 416p1 and a second pivot 416p2 at the portion of the base 416b connected to the stage 416s of the movable support structure 416. For example, the first pivot 416p1 may be pivotably connected to the stage 416s of the movable support structure 416. The chip stack 200 may be secured to the stage 416s of the movable support structure 416 using the above-described methods.

Figure 5B:
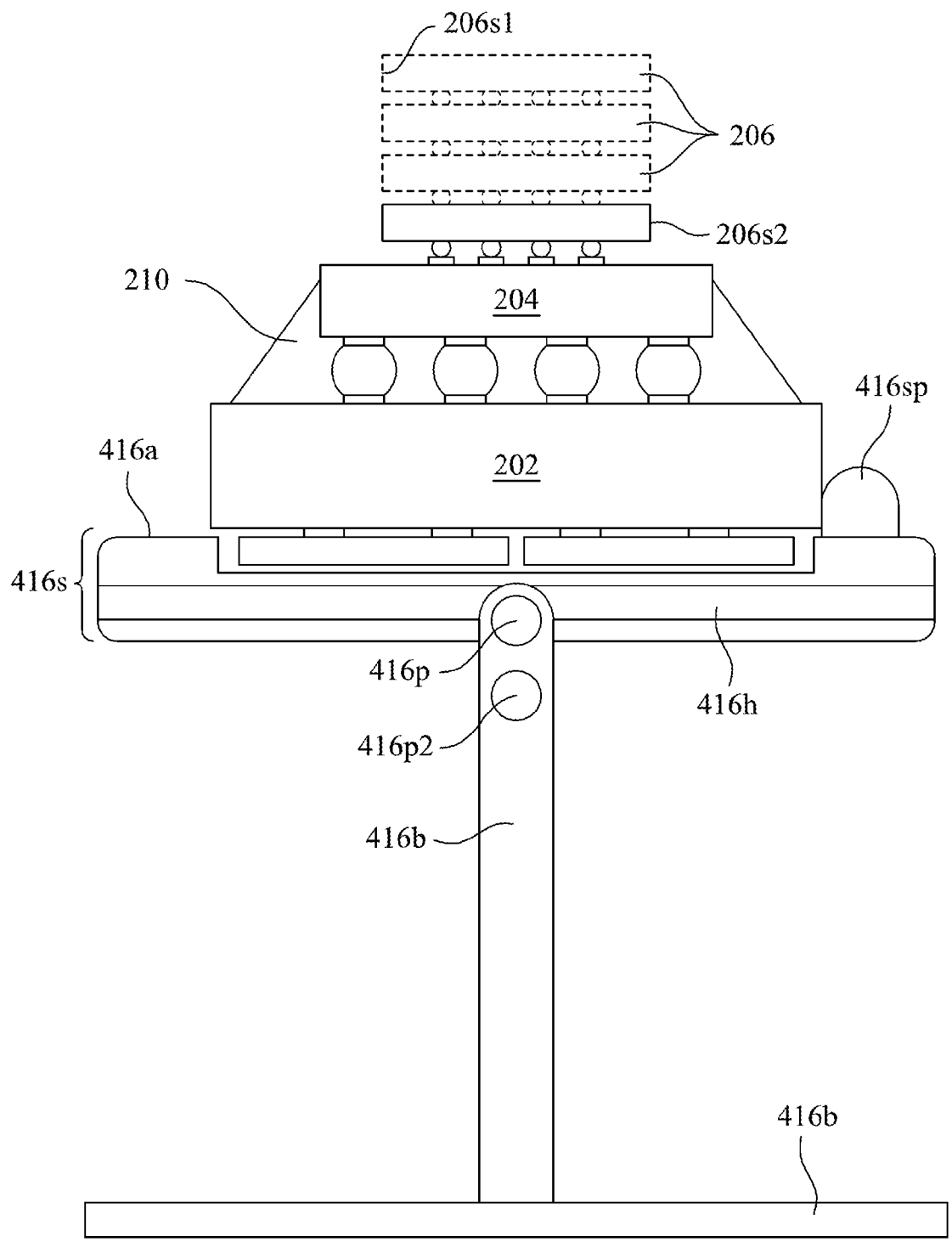
Figure 5C:
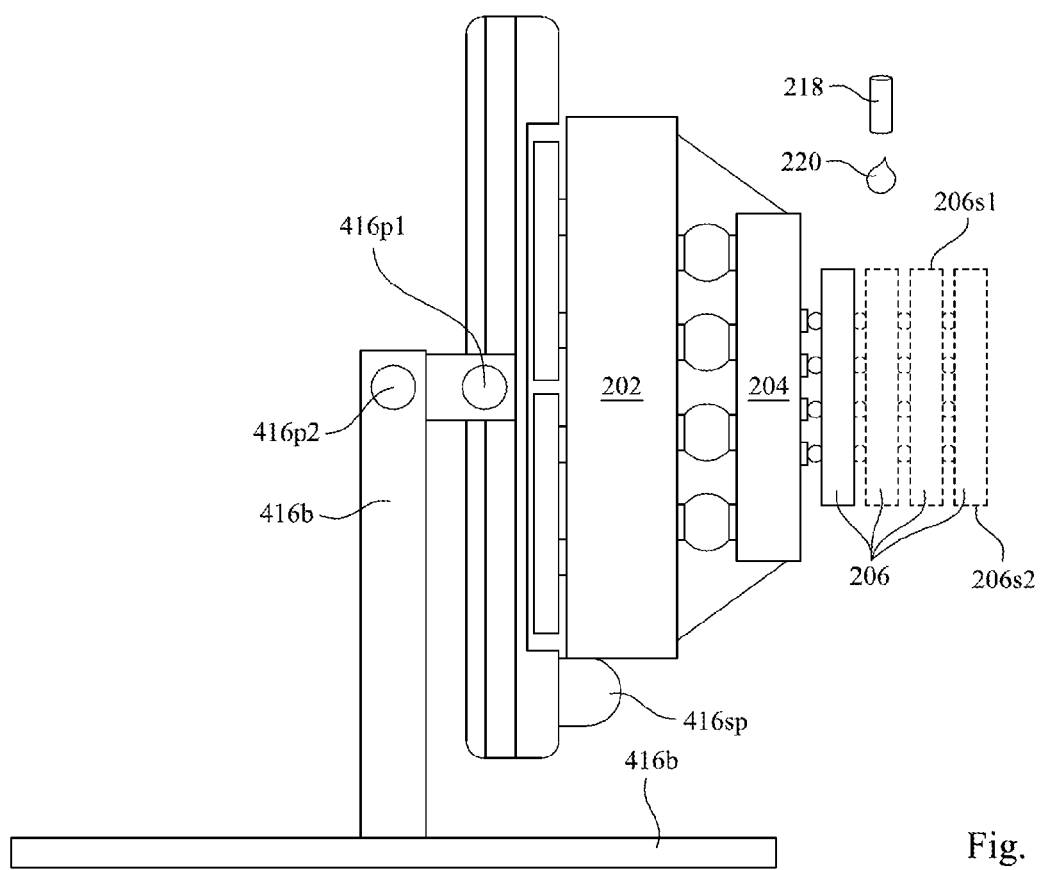

As shown in FIG. 5B, the stage 416s of the movable support structure 416 may be raised, e.g. by extending a portion of the base 416b pivotably connected to the stage 416s. This may be effected by a motor (e.g. a stepper motor) or pneumatically. Subsequently, as shown in FIG. 5C, the stage 416s is tilted to substantially 90 degrees. The chip stack 200 is kept in place by the suction force exerted on the chip stack 200 and by the stopper 416sp.

As shown in FIG. 5C, the dispenser head 218 may be positioned adjacent to the first sidewall 206s1 of the at least one second chip 206. The underfill 220 may be dispensed from the dispenser head 218 over the first die 204 and adjacent to the first sidewall 206s1 of the at least one second die 206. The underfill 220 may be dispensed in multiple (e.g. two or more) dispense passes. Subsequently, the underfill 220 flows, under the influence of gravity, through the first standoff gap G1 from the first sidewall 206s1 to the second sidewall 206s2 of the at least one second die 206. In the embodiment where the at least one second die 206 includes the plurality of vertically stacked second dies 206, the underfill 220 additionally flows, under the influence of gravity, through the second standoff gaps G2 from the first sidewall 206s1 to the second sidewall 206s2 of the at least one second die 206. The heating element 216h may be used to heat the underfill 220 as it flows from the first sidewall 206s1 to the second sidewall 206s2 of the at least one second die 206. After the underfill 220 has sufficiently flowed to encapsulate the at least one second die 206 and fill the first standoff gap G1 and the second standoff gaps G2, the chip stack 200 may be removed from the movable support structure 416, and the resultant chip stack 200 may resemble the chip stack 200 shown in FIG. 2E.

Figure 6:
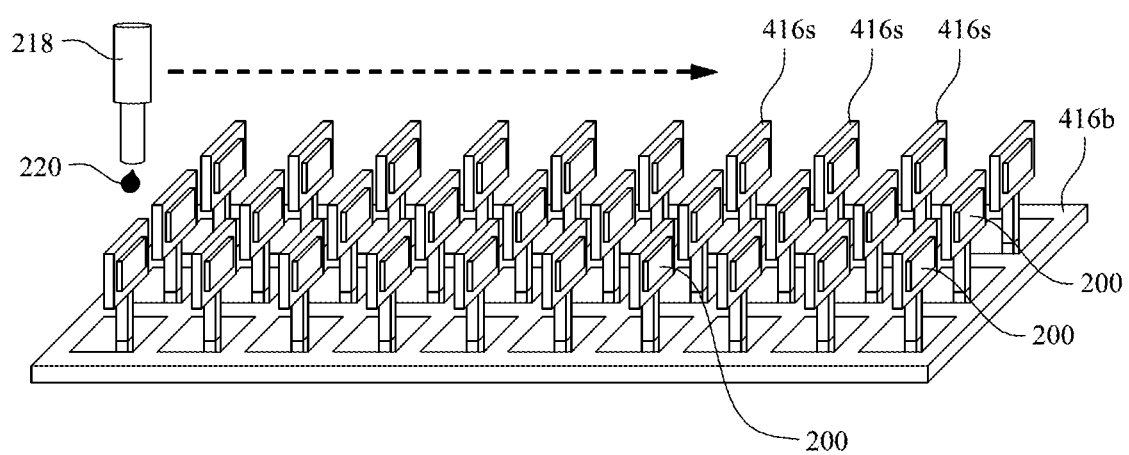
FIG. 6 shows a plurality of chip stacks attached to a plurality of movable support structures, in accordance with some embodiments.

FIG. 6 shows an embodiment where a plurality of chip stacks 200 are placed on a plurality of movable support structures 416. The stages 416s of each of the plurality of movable support structures 416 may be tilted (e.g. simultaneously tilted), and the dispenser head 218 may dispense the underfill 220 on each of the plurality of chip stacks 200, e.g. in sequence (in other words, one after another).

Figure 7A:
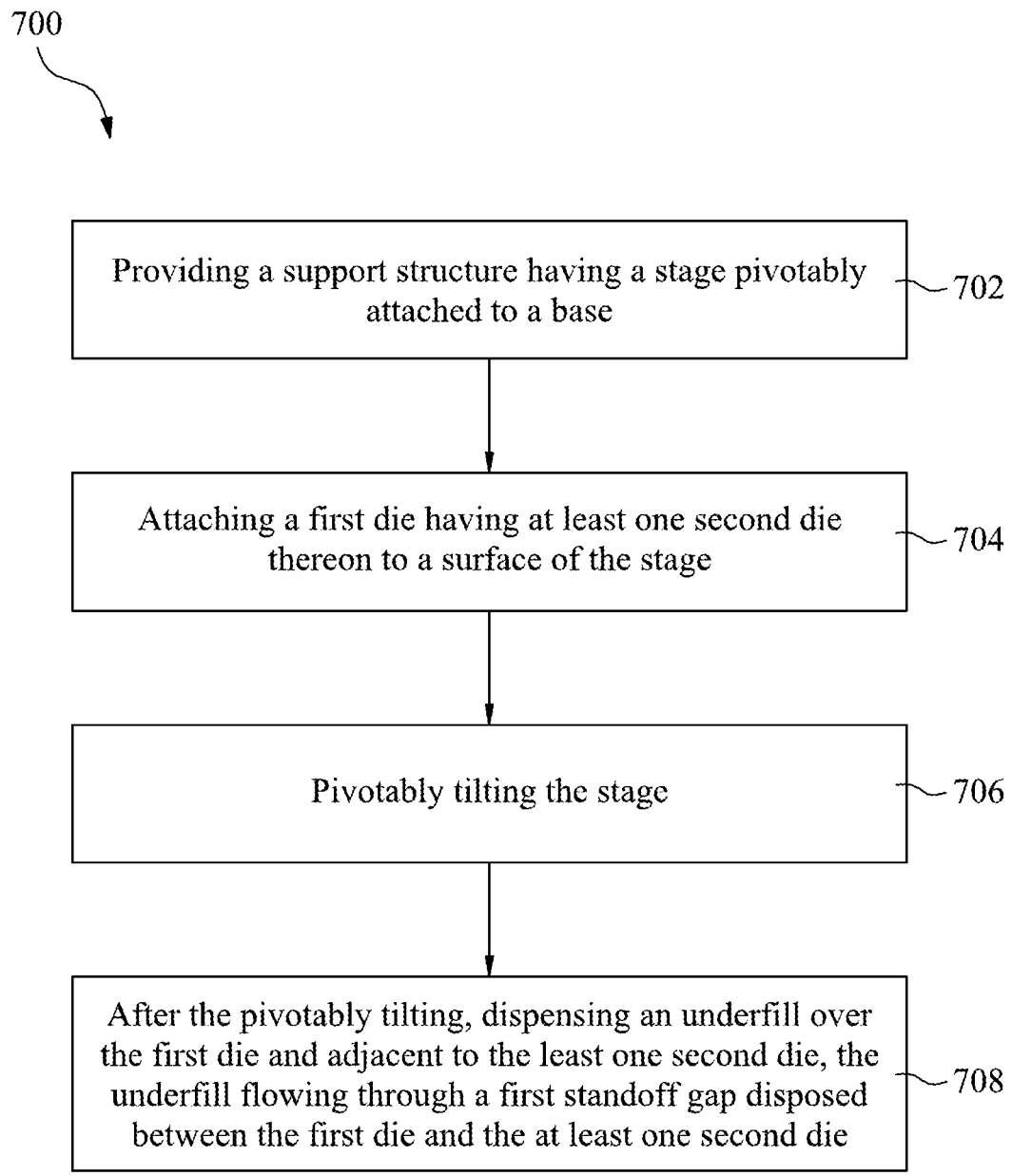
FIGS. 7A and 7B show methods for manufacturing a chip package, in accordance with some embodiments.

As described above, the process flows described above in respect of FIGS. 4A to 4C and FIGS. 5A to 5C are embodiments of the method 100 shown in FIG. 1. Another method 700 (shown in FIG. 7A) for manufacturing a chip package may be derived from the method 100 and from the process flows shown in FIGS. 4A to 4C and FIGS. 5A to 5C. The method 700 may include providing a support structure having a stage pivotably attached to a base (in 702), and attaching a first die having at least one second die thereon to a surface of the stage (in 704). The method 700 may further include a step 706 where the stage is pivotably tilted. In step 708 of the method 700, an underfill is dispensed over the first die and adjacent to the least one second die. Furthermore, in step 708 of the method 700, the underfill flows through a first standoff gap disposed between the first die and the at least one second die.

Figure 7B:
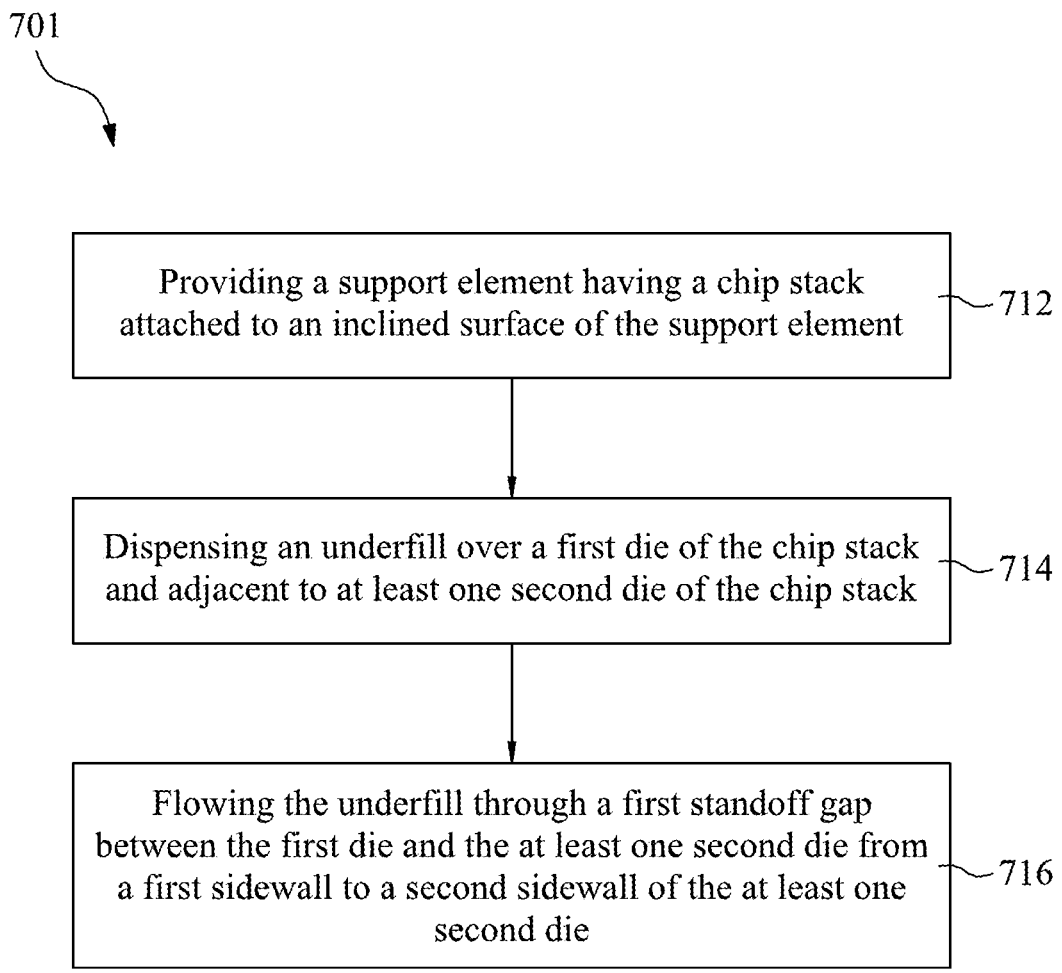

Yet another method 701 (shown in FIG. 7B) for manufacturing a chip package may be derived from the method 100 and from the process flows shown in FIGS. 4A to 4C and FIGS. 5A to 5C. The method 701 may include providing a support element having a chip stack attached to an inclined surface of the support element (in 712), and dispensing the underfill over a first die of the chip stack and adjacent to at least one second die of the chip stack (in 714). The method 701 may further include flowing the underfill through a first standoff gap between the first die and the at least one second die from a first sidewall to a second sidewall of the at least one second die (in 716).

Figure 8:
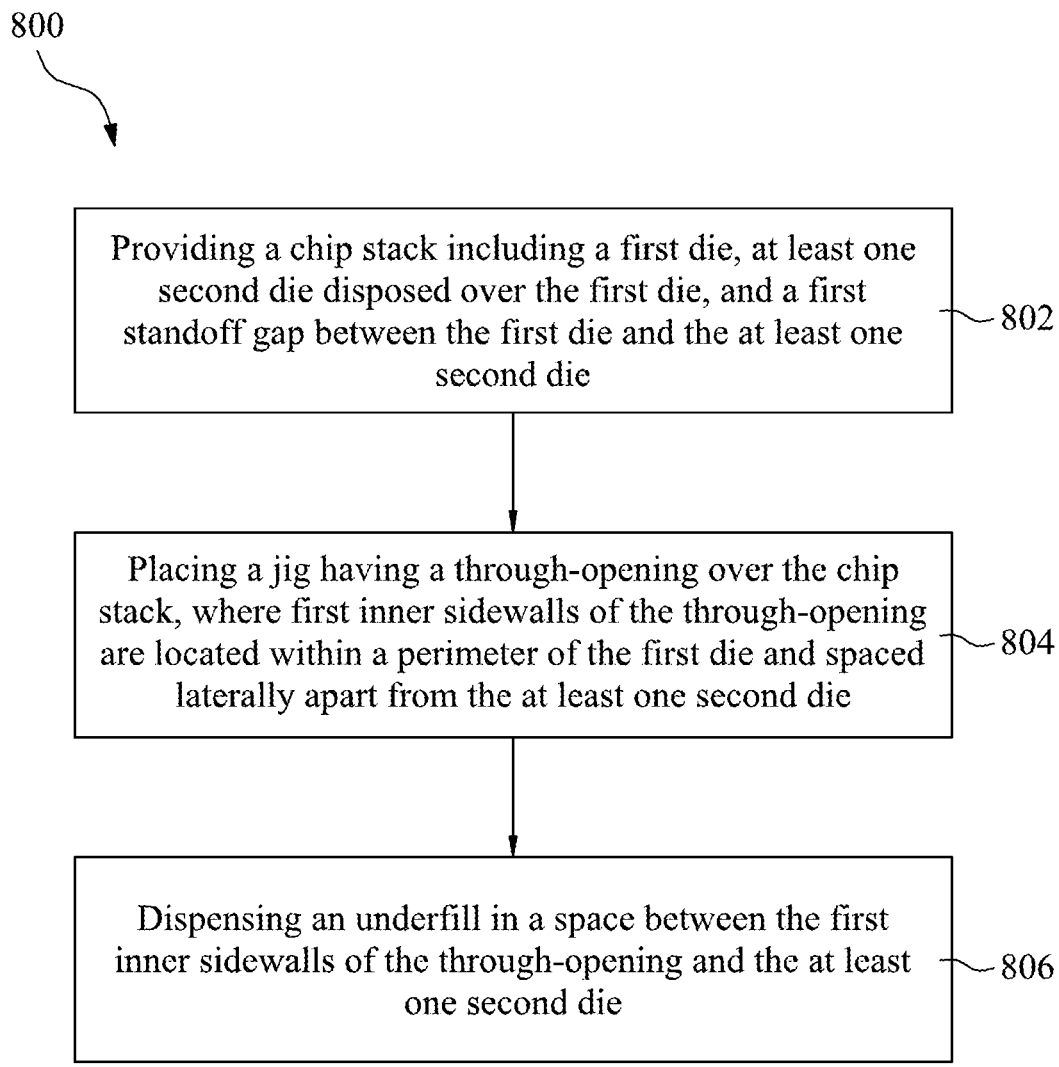
FIG. 8 show another method for manufacturing a chip package, in accordance with other embodiments.

FIG. 8 shows another method 800 for manufacturing a chip package, in accordance with one or more embodiments. The method 800 may include providing a chip stack including: a first die; at least one second die disposed over the first die; and a first standoff gap between the first die and the at least one second die (in 802). The method 800 may further include step 804 where a jig having a through-opening is placed over the chip stack. The through-opening may have first inner sidewalls located within a perimeter of the first die and may be spaced laterally apart from the at least one second die. In step 806 of the method 800, an underfill is dispensed in a space between the first inner sidewalls of the through-opening and the at least one second die.

Figure 9:
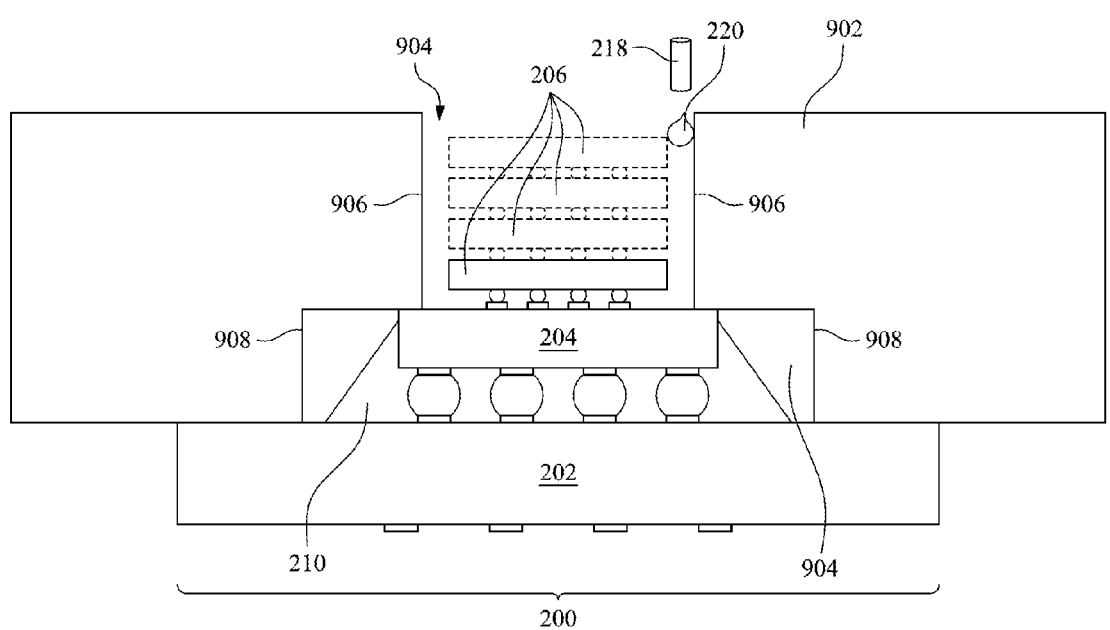
FIG. 9 illustrates the method shown in FIG. 8, in accordance with some embodiments.

FIG. 9 illustrates the method 800 shown in FIG. 8, in accordance with one or more embodiments. The description that follows describes the method 800 in the context of manufacturing a die-on-die 3D chip package. However, it may be noted that the method 800 may analogously be applied to the manufacture of other 3D chip packages, such as a wafer-on-wafer 3D chip package and a die-on-wafer 3D chip package.

As shown in FIG. 9, a jig 902 may be placed over the first die 204 of the chip stack 200. In an embodiment, the jig 902 may include a polymer (e.g. a nanomaterial polymer). In another embodiment, the jig 902 may include teflon. For example, the jig 902 may include a coating of teflon or a polymer. The jig 902 may include a through-opening 904, which may be defined by first inner sidewalls 906 and second inner sidewalls 908. A lateral extent of the through-opening 904 between the first inner sidewalls 906 may be smaller than a lateral extent of the through-opening 904 between the second inner sidewalls 908, as shown in the example of FIG. 9.

As shown in FIG. 9, the at least one second die 206 and the first die 204 may be disposed within the through-opening 904. The first die 204 may be spaced apart from the second inner sidewalls 908 of the jig 902, while the at least one second die 206 may be spaced apart from the first inner sidewalls 906 of the jig 802. A gap between the at least one second die 206 and the first inner sidewalls 906 of the jig 902 may be less than 500 microns (e.g. in a range from about 50 microns to about 200 microns).

As shown in FIG. 9, the dispenser head 218 may be positioned above the through-opening 904 of the jig 802, and the underfill 220 may be dispensed from the dispenser head 218 in a space between the first inner sidewalls 906 of the through-opening 904 and the at least one second die 206. The underfill 220 may be dispensed in multiple (e.g. two or more) dispense passes. Subsequently, the underfill 220 flows through the first standoff gap G1 from the first sidewall 206s1 to the second sidewall 206s2 of the at least one second die 206. In the embodiment where the at least one second die 206 includes the plurality of vertically stacked second dies 206, the underfill 220 additionally flows through the second standoff gaps G2 from the first sidewall 206s1 to the second sidewall 206s2 of the at least one second die 206. After the underfill 220 has sufficiently flowed to encapsulate the at least one second die 206 and fill the first standoff gap G1 and the second standoff gaps G2, jig 902 may be removed from the chip stack 200, and the resultant chip stack 200 may resemble the chip stack 200 shown in FIG. 2E.

An advantage provided by the process described above includes increasing the time available for the underfill 220 to flow through the first standoff gap G1 and the second standoff gaps G2. This may be a consequence of the jig 902 functioning as a dam that prevents bleeding of the underfill 220 onto the underfill layer 210 or onto the substrate 202. In an example where the at least one second chip 206 is subsequently covered with a cap or a lid 222 (e.g. as shown in FIG. 2G), the absence of bleeding of the underfill 220 may allow provision of an air gap between the underfill 220 and the lid 222, which may be useful for preventing heat generated during operation or testing of the first die 204 (e.g. logic die) from being conducted through the lid 222 to the at least one second die 206. This may, in turn, prevent burn out (e.g. memory burn out) of the at least one second die 206.

According to an embodiment presented herein, a method of manufacturing a chip package is provided. The method may include providing a support structure having a chip stack attached to an inclined surface of the support structure. The chip stack that is attached to the inclined surface of the support structure may include a first chip, at least one second chip disposed over the first chip, and a first standoff gap between the first chip and the at least one second chip. The at least one second die may have a first sidewall and a second sidewall opposite the first sidewall, and the first sidewall may be disposed higher on the inclined surface of the support structure than the second sidewall. The method may further include dispensing the underfill over the first die and adjacent to the first sidewall of the at least one second die. A consequence of the dispensing step may be the underfill flowing through the first standoff gap from the first sidewall to the second sidewall of the at least one second die.

According to another embodiment presented herein, a method of manufacturing a chip package is provided. The method may include providing a support structure, which includes a base and a stage pivotably attached to the base. The method may further include attaching a first die having at least one second die disposed thereon to a surface of the stage, and pivotably tilting the stage. After pivotably tilting the stage, an underfill may be dispensed over the first die and adjacent to the least one second die. A consequence of the dispensing step may be the underfill flowing through a first standoff gap disposed between the first die and the at least one second die.

According to yet another embodiment presented herein, a method of manufacturing a chip package is provided. The method may include: providing a chip stack including: a first die; at least one second die disposed over the first die; and a first standoff gap between the first die and the at least one second die. The method may further include placing a jig having a through-opening over the chip stack. The through-opening of the jig may have first inner sidewalls that are located within a perimeter of the first die and that are spaced laterally apart from the at least one second die. The method may further include dispensing an underfill in a space between the first inner sidewalls of the through-opening and the at least one second die. A consequence of the dispensing step may be the underfill flowing through the first standoff gap disposed between the first die and the at least one second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a support structure having a chip stack attached to an inclined surface of the support structure, the chip stack comprising:
   a substrate;
   a first integrated circuit die, the first integrated circuit die having contact pads on a top major surface thereof and on a bottom major surface thereof, the contact pads on the bottom major surface of the first integrated circuit die being mounted to the substrate by connectors;

a first underfill material encapsulating the connectors;

at least one second die disposed over the first integrated circuit die, a first second die of the at least one second die being mounted on the first integrated circuit die and electrically connected to the contact pads on the top major surface of the first integrated circuit die by second connectors; and a first standoff gap between the first integrated circuit die and the at least one second die, wherein the at least one second die has a first sidewall and a second sidewall opposite the first sidewall, the first sidewall disposed higher on the inclined surface of the support structure than the second sidewall; and dispensing a second underfill over the first integrated circuit die and adjacent to the first sidewall of the at least one second die, the second underfill flowing through the first standoff gap from the first sidewall to the second sidewall of the at least one second die.

2. The method of claim 1, wherein the dispensing the second underfill over the first sidewall of the at least one second die comprises a jetting process.

3. The method of claim 1, wherein the providing the support structure having the chip stack attached to the inclined surface of the support structure comprises:

placing the chip stack on the inclined surface of the support structure; and securing the chip stack to the inclined surface of the support structure by a suction force delivered through the support structure.

4. The method of claim 3, wherein the placing the chip stack on the inclined surface of the support structure comprises:

determining an incline angle for the inclined surface of the support structure;

pivotably tilting a portion of the support structure based on the incline angle to form the inclined surface of the support structure; and disposing the chip stack on the inclined surface of the support structure.

5. The method of claim 4, wherein the pivotably tilting the portion of the support structure based on the incline angle to form the inclined surface of the support structure comprises exerting a repulsion force or an attraction force on a distal end of the portion of the support structure.

6. The method of claim 5, wherein the exerting the repulsion force or the attraction force on the distal end of the portion of the support structure comprises generating a magnetic field to exert the repulsion force or the attraction force on the distal end of the portion of the support structure.

7. The method of claim 1, wherein the providing the support structure having the chip stack attached to the inclined surface of the support structure comprises:

attaching the chip stack to a surface of the support structure; and pivotably tilting the surface of the support structure to form the inclined surface of the support structure having the chip stack attached thereto.

8. The method of claim 7, wherein the attaching the chip stack to the surface of the support structure comprises:

placing the chip stack on the surface of the support structure; and securing the chip stack to the surface of the support structure by a suction force delivered through the support structure.

9. The method of claim 1, wherein the providing the support structure having the chip stack attached to the inclined surface of the support structure comprises providing the support structure having the substrate of the chip stack attached to the inclined surface of the support structure.

10. The method of claim 1, wherein the at least one second die comprises a plurality of vertically stacked second dies having a second standoff gap between each of the plurality of vertically stacked second dies, and wherein the dispensing further comprises dispensing the second underfill at a side of the second standoff gaps, the second underfill flowing through the second standoff gaps.

11. The method of claim 1, further comprising:

after the dispensing, heating the second underfill by providing thermal energy to the second underfill through the support structure.

12. A method comprising:

providing a support structure comprising:

a base; and a stage pivotably attached to the base, the stage having a surface facing away from the base;

attaching a first die having at least one second die disposed thereon to the surface of the stage;

generating a magnetic field to pivotably tilt the stage; and after the pivotably tilting, dispensing an underfill over the first die and adjacent to the at least one second die, the underfill flowing through a first standoff gap disposed between the first die and the at least one second die.

13. The method of claim 12, wherein the pivotably tilting the surface of the stage comprises exerting a repulsion force or an attraction force on a lateral portion of the stage.

14. The method of claim 12, wherein the attaching the first die having at least one second die disposed thereon to the surface of the stage comprises:

placing the first die on the surface of the stage; and securing the first die to the surface of the stage by a suction force delivered to the surface of the stage.

15. The method of claim 12, wherein generating the magnetic field comprises generating the magnetic field at a lateral portion of the base using a magnet located over the base and below the stage.

16. The method of claim 12, further comprising dampening the tilting of the stage while pivotably tilting the stage.

17. A method, comprising:

placing a chip stack on a support structure comprising a base, a stage pivotably attached to the base, and resilient structures attached between lateral portions of the base and lateral portions of the stage;

pivotably tilting the stage of the support structure to form an inclined stage, the resilient structures dampening the tilting of the stage; and dispensing an underfill over a portion of the chip stack.

18. The method of claim 17, wherein the chip stack comprises a substrate, a first die over the substrate, and at least one second die over the first die, and wherein the dispensing the underfill comprises jetting the underfill over the first die and laterally adjacent to the at least one second die, the underfill flowing through a standoff gap between the first die and the at least one second die.

19. The method of claim 17, wherein the pivotably tilting the stage of the support structure comprises generating a magnetic field to pivotably tilt the stage.

20. The method of claim 17, wherein the pivotably tilting the stage of the support structure comprises pre-determining an incline angle for the inclined stage and pivotably tilting the stage based on the pre-determined incline angle.

* * * * *